United States Patent [19]

Weaver, II et al.

[11] Patent Number: 4,586,243
[45] Date of Patent: May 6, 1986

[54] METHOD FOR MORE UNIFORMLY SPACING FEATURES IN A SEMICONDUCTOR MONOLITHIC INTEGRATED CIRCUIT

[75] Inventors: John R. Weaver, II; Nathaniel D. McClure, both of Kokomo, Ind.

[73] Assignee: General Motors Corporation, Detroit, Mich.

[21] Appl. No.: 672,994

[22] Filed: Nov. 19, 1984

Related U.S. Application Data

[62] Division of Ser. No. 458,166, Jan. 14, 1983, Pat. No. 4,544,940.

[51] Int. Cl.4 .................. H01L 21/265; H01L 21/26; B05D 3/06
[52] U.S. Cl. .......................... 29/578; 29/571; 29/576 B; 148/1.5; 148/187; 357/34; 357/91
[58] Field of Search .................. 29/578, 576 B, 571; 148/1.5, 187; 357/34, 91

[56] References Cited

U.S. PATENT DOCUMENTS

| | | |
|---|---|---|
| 3,210,188 | 10/1965 | Gorig ........................ 96/38 |
| 3,769,112 | 10/1973 | Shaheen et al. ............ 156/11 |
| 3,945,847 | 3/1976 | Schinella et al. .......... 148/1.5 |
| 4,001,061 | 1/1977 | Ahn et al. ................... 156/3 |
| 4,157,268 | 6/1979 | Bergeron et al. .......... 148/1.5 |
| 4,268,951 | 5/1981 | Elliott et al. ............... 29/571 |
| 4,268,952 | 5/1981 | Gaensslen et al. ........ 29/571 |
| 4,272,307 | 6/1981 | Mayrand ................... 148/187 |
| 4,329,703 | 5/1982 | Priel et al. ................. 29/72 |
| 4,341,571 | 7/1982 | Hiss et al. .................. 148/1.5 |
| 4,368,573 | 1/1983 | De Brebisson et al. .... 29/578 |
| 4,376,658 | 3/1983 | Sigusch ..................... 29/578 |
| 4,398,964 | 8/1983 | Malwah ..................... 148/1.5 |
| 4,419,685 | 12/1983 | Sugawara .................. 357/53 |
| 4,435,225 | 3/1984 | Shidler et al. ............. 148/1.5 |
| 4,455,742 | 6/1984 | Williams et al. .......... 29/576 B |
| 4,479,830 | 10/1984 | Koshino et al. ........... 148/1.5 |
| 4,509,250 | 4/1985 | Blossfeld .................. 29/578 |

Primary Examiner—Upendra Roy
Attorney, Agent, or Firm—Robert J. Wallace

[57] ABSTRACT

The unique initial masking step is used in a method of more predictably and uniformly spacing features on a surface of a semiconductor device by combinining it with two dielectric maskants. A unique semiconductor device masking is claimed in which semiconductor device features are initially spaced by means of pitch, i.e. line and a contiguous space, instead of just a line in the initial masking.

7 Claims, 34 Drawing Figures

METHOD FOR MORE UNIFORMLY SPACING FEATURES IN A SEMICONDUCTOR MONOLITHIC INTEGRATED CIRCUIT

This patent application is a division of my U.S. patent applicaion Ser. No. 458,166, that was entitled "A Method for More Uniformly Spacing Features in a Semiconductor Monolithic Integrated Circuit" and was filed on Jan. 14, 1983, now U.S. Pat. No. 4,544,940.

FIELD OF THE INVENTION

This invention relates to the manufacture of semiconductor devices. It more specifically involves a photolithographic (or photomasking) technique for more consistently and uniformly controlling feature, i.e. detail, spacing in an integrated circuit.

In a conventional semiconductor manufacturing process spaced apart regions on a semiconductor surface can be formed by opening adjacent but noncontiguous windows in an overlying photoresist coating. Each window corresponds to one region. The two windows are spaced by an intervening strip of photoresist. In such a process the space between the two regions on the semiconductor surface will vary if the photoresist swells or shrinks or if etchant undercut occurs during the photolithographic process.

It is unlikely that the photoresist will act exactly the same from lot to lot of photoresist, from batch to batch of slices processed, from slice to slice in a given batch, and for that matter from edge to edge across the face of a single slice. The reasons for this can be several including differences in photoresist chemistry, differences in photoresist mixture uniformity, differences in photoresist coating uniformity, differences in photoresist exposure, differences in photoresist development, differences in time exposed to an etchant, etc. One can usually keep these differences quite small by consistent processing. Otherwise, they would become intolerable. On the other hand, these differences can still be significant when precise feature spacing is critical. For example, spacing between the emitter and collector of a lateral bipolar transistor affects its maximum operating frequency, gain, collector punch-through, etc. In a lateral-type bipolar transistor, such spacing is determined by the spacing of emitter and collector regions on the same semiconductor surface. In a conventional, i.e. horizontal, field effect transistor, source and drain spacing on the same semiconductor surface affects maximum operating frequency, drain punch-through, etc. If obtaining a very precise transistor gain, cut-off frequency, etc., is critical to a given circuit, the variations in photoresist performance may force one to accept a lower gain, operating frequency, or the like, simply because one cannot achieve a high enough manufacturing consistency, i.e. yield, of high performance devices. Other undesirable alternatives, of course, might be that one has to use more of such devices or considerably more complex circuitry to get the desired circuit performance. If the latter is not practical, one may simply have to accept low yields of the high performance devices. However, these alternatives usually involve higher costs.

Accordingly, it can be seen that there is room for improvement in controlling feature spacing on a semiconductor wafer. We have found a photoetching technique by which such emitter-collector and source-drain spacing can be much more consistently and uniformly reproduced, not only across the face of a given slice but also from slice to slice and lot to lot.

OBJECTS AND SUMMARY OF THE INVENTION

It is, therefore, an object of this invention to provide an improved photolithographic process for the manufacture of semiconductor integrated circuits that utilizes pitch to provide an initial pattern for separation of device features.

More specifically, it is an object of this invention to provide a semiconductor photolithographic process that affords improved consistency and uniformity in the spacing of semiconductor device features.

Still another object of this invention is to provide a mask for controlling device feature spacing that utilizes pitch to separate the device feature.

A further object of this invention is to provide a semiconductor device having more precise surface feature spacing.

The objects of this invention are obtained by spacing two adjacent features on a semiconductor device surface by pitch, i.e. a line and contiguous space, rather than by a line or space alone. One initially masks one feature positively (i.e. covers it) and the other negatively (i.e. uncovers it). In such instance, boundaries of the two adjacent surface features are initially spaced by both negatively and positively defined surface areas between them as well. The two interjacent areas are covered by two different dielectrics, which provide a self-alignment of the two adjacent surface features. The two adjacent surface features are successively formed, not simultaneously formed. The two interjacent dielectrics can be replaced in the resultant product. However, a characteristic stepped surface conformation remains.

BRIEF DESCRIPTION OF THE DRAWINGS

Other objects, features and advantages of this invention will become more apparent from the following description of preferred examples thereof and from the drawings, in which:

FIG. 4 shows an elevational view along the line 4—4 of FIG. 3a;

Background lines and semiconductor material cross section lines are omitted in the Figures to better focus on the unique surface geometries of this invention. For analogous reasons, relative thickness of surface layers, buried layers and surface steps are not drawn to scale.

DESCRIPTION OF THE PREFERRED EMBODIMENTS

Figure 1A:
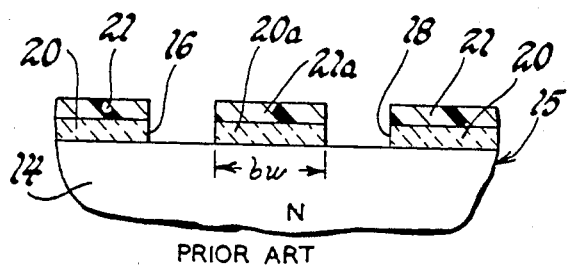
FIGS. 1a and 1b show successive diagrammatic cross-sectional fragmentary views of a semiconductor device as produced by conventional photolithography.
Figure 1B:
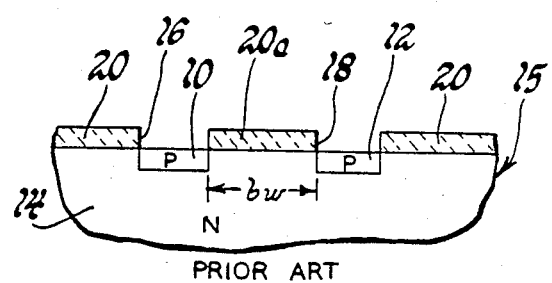

FIGS. 1a and 1b show the two successive stages typically seen when forming two adjacent island-like P-type regions 10 and 12 in an N-type semiconductor surface region 14. N-type surface region 14 would ordinarily be a part of a monolithic integrated circuit formed in a silicon chip that is but one portion of a silicon wafer. The wafer is generally designated by reference numeral 15. Island-like P-type regions 10 and 12 are formed by ion implantation through island-like windows 16 and 18 in an overlying blanket layer 20 of silicon dioxide. Windows 16 and 18, and thus regions 10 and 12, are spaced apart by an intervening portion 20a of silicon dioxide that is part of an overlying silicon dioxide layer 20. We consider portion 20a to effectively be a line, spacing windows 16 and 18. It should be noted that the silicon dioxide line 20a extends completely across the surface area between windows 16 and 18. Thus the width of line 20a between windows 16 and 18 will determine the spacing between regions 10 and 12. If these regions comprise a lateral bipolar transistor, this width is the transistor base width, which is referred to as bw in the drawing.

Windows 16 and 18 are normally opened in a blanket coating of silicon dioxide layer 20 by means of photo-etching techniques. In such a process, a photoresist coating 21 is applied to the blanket silicon dioxide coating and then exposed and developed to leave island-like areas of the silicon dioxide coating exposed, where windows 16 and 18 are to be formed. Hydrofluoric acid or the like is then applied to the coated surface to etch windows 16 and 18 in the blanket silicon dioxide coating 20. Depending on the chemistry of the photoresist composition, its uniformity, its exposure, its development, its time in the etchant, etc., the photoresist may shrink, swell or stay the same between the time it is exposed and etched. Analogously there may be a little or a lot of undercutting of the photoresist 21 during etching. Still further, the photoresist change and undercutting may not be uniform from place to place on the wafer 15, or consistent from wafer to wafer, or batch to batch of wafers.

It is well recognized that there can be differences in photoresist shrinkage or swelling or in photoresist undercutting from batch to batch, from wafer to wafer, and even from edge to edge across the face of the same wafer. To minimize such variations, of course, semiconductor processing is carried out with considerable consistency. Nonetheless, minor variations still occur. As hereinbefore indicated, if this spacing is between emitter and collector of a lateral bipolar transistor, or source and drain of a field effect transistor, variations in this spacing affects transistor performance. Normally, windows 16 and 18, i.e. regions 10 and 12, are spaced far enough apart to tolerate these variations. In the alternative one might accommodate these variations by using ancillary circuitry, or by simply accepting the yield losses they produce. The benefits of being able to space such regions apart more consistently and uniformly are several fold, and unnecessary to mention here. Obvious advantages are reduction in device size and cost and in improved performance without increasing circuit complexity.

Our invention is diagrammatically illustrated in FIGS. 2a–2e, for quick comparison with the prior art illustrations of Figures 1a–1b. In FIGS. 2a–2e, P-type island-like regions 10' and 12' are formed in an N-type surface region 14' which is a part of an integrated circuit that is, in turn, but one part of a silicon wafer 15'. In FIGS. 1a and 1b, showing the prior art, it can be seen that the island-like regions 10 and 12 are simultaneously formed. In our invention the island-like regions 10' and 12' are successively formed. In addition, regions 10' and 12' are initially defined by negative and positive masking techniques. In the resultant product shown in FIG. 2e, regions 10' and 12' are spaced by two different dielectrics that are at different surface levels.

More specifically, a window 16' is opened up in a silicon nitride coating 22 on the surface of the N-type region 14' where the region 10' is to be formed. However, a window is not opened in silicon nitride coating 22 over the surface area where the P-type region 12' is to be formed. Instead, an island-like patch 22b is formed over the area where region 12' is to be formed. In forming the silicon nitride patch 22b, one inherently forms the equivalent of a window, i.e. a space, around the patch. Accordingly, between silicon nitride window 16' and silicon nitride patch 22b, one sees in FIG. 2b a silicon nitride strip 22a and a contiguous space 24. Thus, silicon nitride strip 22a and its contiguous space 24 provides the spacing between island-like regions 10' and 12'. Their combined width would equal transistor base width if regions 10' and 12' formed a lateral transistor. Hence, their combined width is designated by bw in FIGS. 2a–2e.

Figure 2A:
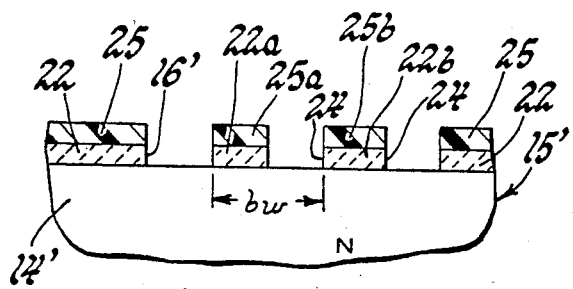
FIGS. 2a through 2e show successive diagrammatic fragmentary cross-sectional views of the same semiconductor device as shown in FIGS. 1a and 1b but as produced by our process.
Figure 2B:
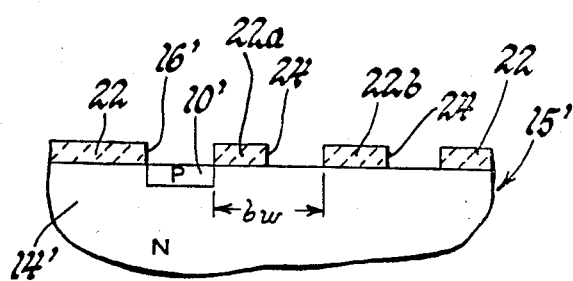

The sequence of steps in our process involves applying a first blanket coating of a photoresist 25 over a blanket coating of silicon nitride 22. The first photoresist layer 25 is exposed and developed to produce openings therein corresponding to the previously described windows 16' and 24 in the silicon nitride coating 22. The exposed silicon nitride coating 22 is then etched away from windows 16' and 24, and the photoresist removed. The resulting product is shown in FIG. 2a. A second layer of photoresist (not shown) is then applied, exposed and developed to cover the window 24. The wafer is then given a boron implantation to form the P-type region 10'. After the photoresist is removed, the wafer 15' is as shown in FIG. 2b. It should be noted that the silicon nitride layer 22 serves as a mask when forming region 10'. Hence, the second photoresist layer (not shown) need not be precisely aligned around window 16'. It is, therefore, a simple, not a critical, masking step.

Figure 2C:
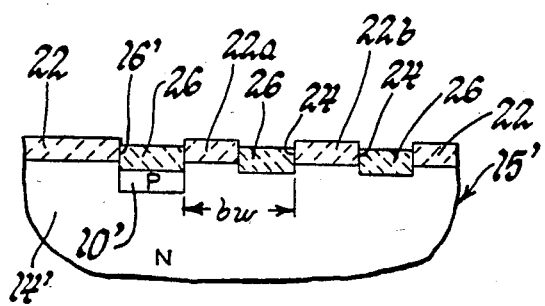
Figure 2D:
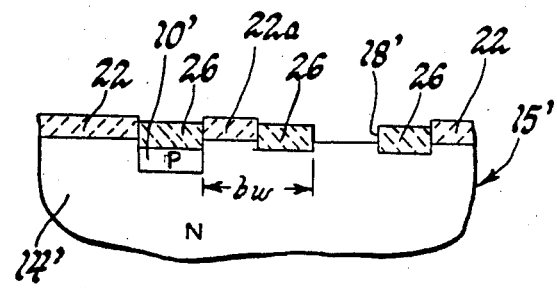
Figure 2E:
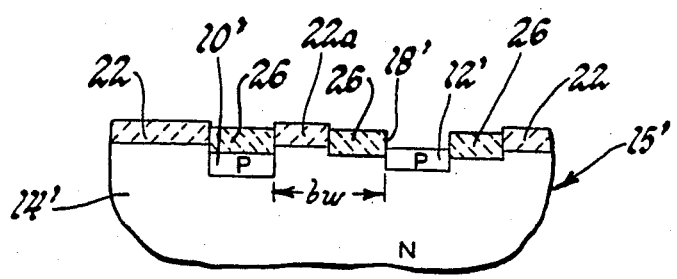

The wafer 15' is then oxidized to form a silicon oxide coating 26 within windows 16' and 24, as shown in FIG. 2c. Wafer 15' is then masked again with photoresist (not shown), to leave a window of photoresist around silicon nitride patch 22a. Like the second masking step, this third masking step is not a critical one. It is not critical because the window periphery can be located anywhere on the silicon oxide 26 surrounding silicon nitride patch 22b. The thus exposed patch 22b is then selectively etched away to open window 18' over the surface area where region 12' is to be formed. After the third mask is removed, the wafer 15' is as seen in FIG. 2d. Region 12' is then formed by ion implantation, or diffusion, to provide the product shown in FIG. 2e.

It can be seen by reference to FIG. 1a that regions 10 and 12 were initially spaced by a line 21a of photoresist between them. On the other hand, in our invention regions 10′ and 12′ are initially spaced in FIG. 2a by both a line 25a and a contiguous space 24. A line and a contiguous space are referred to herein as pitch. By initially spacing the two regions 10′ and 12′ apart by pitch rather than just a line, the photoresist used in the first step to establish the spacing between these regions can swell, shrink or be undercut without changing the dimension referred to as bw. For example, referring to FIG. 2a, if the photoresist patch 25b over silicon nitride patch 22b expands, the adjacent photoresist strip 25a over silicon nitride strip 22a will expand a substantially equal amount. Their lefthand boundaries in FIG. 1a will move a corresponding substantially equal amount. Therefore, base width bw will remain substantially constant. We use the phrase "substantially constant" instead of the word "constant", only because we recognize that theoretically it is still possible to have a difference in swelling, shrinkage or undercutting between the photoresist portions 25a and 25b even though it is so small that it cannot be measured. Accordingly, for all currently measurable purposes their spacing is constant, and even in the most literal sense it is at least substantially constant. Hence, bw is substantially constant.

The foregoing diagrammatically broadly describes our new process in a way to easily compare it with the prior art process. The following is a description of several specific examples of our process. It also more specifically shows the unique surface characteristics of products produced by our process. In FIGS. 3a–3f, FIG. 4 and FIG. 5 we show how our invention can be used to make a concentric-type lateral PNP transistor by ion implantation. FIGS. 3a–3f, 4 and 5 are fragmentary sectional views of one lateral transistor in an integrated circuit that is, in turn, just one part of a silicon wafer 28. The integrated circuit, of course, would be present in wafer 28 as a repetitive pattern, whereby a number of individual integrated circuits could be simultaneously produced on the same silicon wafer. Each pattern is eventually separated from wafer 28 as a discrete chip. Wafer 28 would normally be a monocrystalline silicon circular slice 7–11 centimeters in diameter and having a thickness of about 0.4–0.6 millimeter. P-type region 30 would form the majority thickness of the wafer, and would typically have a resistivity of about 5–30 ohm-centimeters. The particular resistivity of region 30, and for that matter of all the semiconductor regions shown, of course will depend upon the electrical characteristics desired in the finished devices. The thickness of the wafer is ordinarily a function of the wafer size being processed, with 8 centimeter diameter wafers usually being about 0.4 millimeter thick.

An N+ type layer 32 is buried under an N-type epitaxial surface layer 34. Hence, N+ type layer 32 is referred to as a buried layer. The N-type epitaxial surface layer 34 can have a thickness of about 10 microns and a resistivity of about 5–10 ohm-centimeters. The buried layer 32 would have a resistivity at least an order of magnitude less.

If desired, isolation regions (not shown) and deep N+ contact regions (also not shown) can also be included in the structure. In any event, the wafer 28 is processed through the substrate buried layer, epitaxy, isolation and deep N+ diffusions using conventional techniques.

The process continues by depositing a silicon dioxide blanket coating 35 about 500 angstroms thick onto the upper surface 36 of wafer 28. A 5,000–8,000 angstrom thick silicon nitride blanket coating 38 is deposited next. The blanket silicon nitride coating 38 can be deposited in any convenient manner as, for example, by pyrolosis of a silicon containing hydrocarbon gas at high temperature. It should be understood that use of the thin silicon dioxide blanket 35 is preferred but is not material to this invention.

A 5,000–8,000 angstrom thick blanket coating of photoresist 40 is then applied over the blanket silicon nitride coating 38. The photoresist 40 is exposed and developed to form the etch mask shown in FIG. 3a, using normal and accepted techniques. However, the etch mask pattern is unique. The photoresist exposure mask (not shown) has a complementarily unique pattern. The exposure mask will be complementary to the etch mask, and will vary, depending on whether the photoresist 40 is a positive or negative photoresist. The etch mask pattern includes an inner island-like window 42 that uncovers an inner island-like wafer surface portion 36a that will be the emitter surface in the resultant transistor. This part of the pattern is not unique. The unique part of the etch mask pattern surrounds surface portion 36a. A principal distinguishing characteristic in our unique pattern is that the surface portion 36b, that will eventually become the collector surface in the resultant transistor, is not also uncovered. Instead collector surface area 36b remains covered by an outer concentric photoresist ring 40b. Our unique pattern is further distinguished in that emitter window 42 and collector photoresist ring 40b are spaced by an inner concentric photoresist ring 40c and an intermediate concentric annular photoresist window 44. In addition, the photoresist outer concentric ring 40b is surrounded by an outer concentric annular photoresist window 46. Still another photoresist window 48 is seen, which could be used in making any other adjacent surface feature or device desired in the integrated circuit being formed on wafer 28.

In any event, the opening of windows 42, 44, 46 and 48 in the photoresist coating 40, transforms photoresist coating 40 into an etch mask. Wafer 28 is then exposed to a silicon nitride etchant, as for example, plasma etching with carbon tetrafluoride and oxygen, or wet etching with orthophosphoric acid at 150°–160° C. for 10–60 minutes. This etching opens corresponding windows 42a, 44a, 46a, and 48a in the silicon nitride coating 38. One also opens corresponding windows 42b, 44b, 46b and 48b in the silicon dioxide coating 35. This can be done by dipping wafer 28 in a hydrofluoric acid-based etchant for 5–10 seconds. This exposes the underlying island-like emitter surface portion 36a and the concentric annular surface portions 36d and 36e. It can be seen that annular surface portions 36d and 36e are disposed on opposite sides of collector surface portion 36b. The silicon oxide 35 is analogously also removed in other places on the wafer as, for example, at 48b where other surface features and/or regions of other devices can be formed.

Figure 3A:
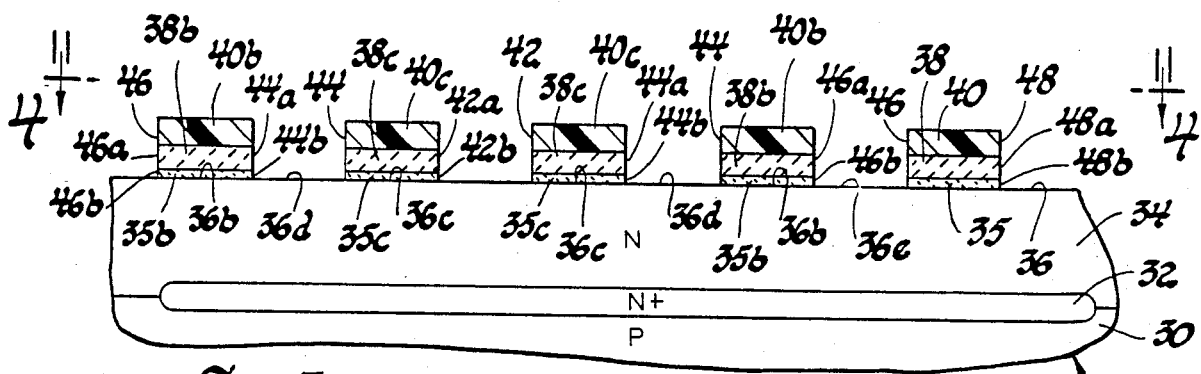
FIGS. 3a through 3f show successive detailed cross-sectional fragmentary views of a concentric lateral transistor as produced by our process using ion implantation for doping.
Figure 3B:
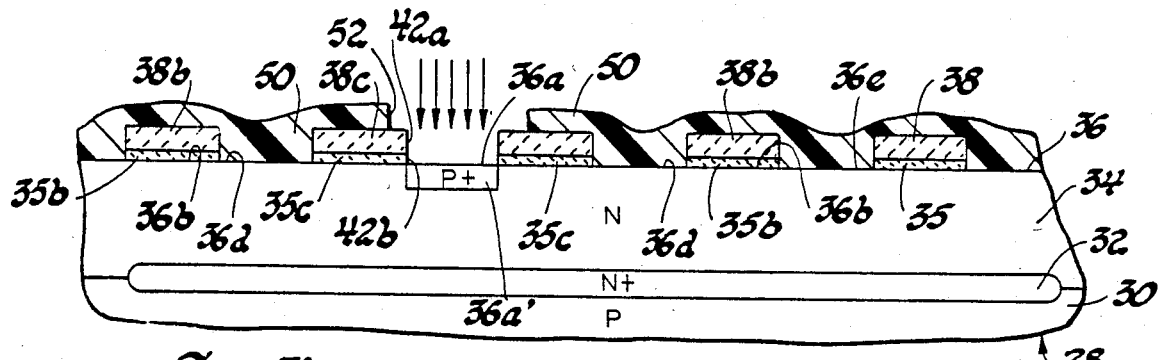

The first photoresist coating 40 is then stripped off wafer 28, and a second 5,000–8,000 angstrom thick blanket photoresist coating 50 is applied to wafer upper surface 36. The second blanket photoresist coating 50 is also exposed by normal and accepted techniques to form a second mask on wafer 28. However, it provides only one window 52 in the photoresist coating 50 overlying the surface area of this invention. No window is formed over collector surface portion 36b. In addition, window 52 need not be precisely registered with the windows 42a and 42b in the silicon nitride and silicon oxide coatings. Window 52 need only be an island-like window having its entire periphery somewhere on the upper surface of the inner silicon nitride ring 38c, as shown in FIG. 3b. Since only a coarse alignment of window 52 is required, this is a high yield masking step.

It can also be seen from FIG. 3b that the oversize window 52 allows emitter surface area 36a to be precisely automatically defined by the edges on the windows 42a and 42b in the silicon nitride annulus 38c and the silicon dioxide annulus 35c, respectively. Wafer 28 is then given a blanket implant of $^{11}B^+$ at a dosage of about $1 \times 10^{14} - 1 \times 10^{16}$ atoms per square centimeter at an energy of approximately 100-150 keV. This provides a 0.7 micron deep region 36a' of P+ type doping beneath the exposed surface region 36a. After activation by subsequent heating steps for wafer 28, region 36a' will provide an emitter region for the lateral PNP transistor which is to be formed.

As previously mentioned, photoresist layer 50 is about 5,000-8,000 angstroms thick. This is a rather conventional thickness. Coincidentally, it is also thick enough to mask uncovered portions 36d and 36e from the aforementioned ion implantation. Silicon nitride layer 38 is also 5,000-8,000 angstroms thick. This is thick enough to mask surface 36 from the ion implantation. Since no significant concentration of ions can thus penetrate the photoresist 50 and/or silicon nitride 38, the ion implantation forms an opposite conductivity doping only under surface portion 36a in region 36a'. Incidentally, the aforementioned thicknesses would even be thick enough to block out an ion implantation of higher energy and dosage, i.e. up to 200 keV, such as one might want to use to perform a 5 micron deep P+ emitter region 36a' for a higher performance PNP transistor.

Photoresist 50 is then stripped from wafer 28. Wafer 28 can then be oxidized in air or oxygen at about 900°-1100° C. to produce a thick silicon dioxide coating 35a, 35d and 35e on wafer surface, all portions not covered by silicon nitride coating 38. A sufficient thickness of the silicon oxide coating portions 35a, 35d and 35e are grown to serve as a mask for a second ion implantation step that is to be performed later in forming collector region 36b'. About 5,000-8,000 angstroms of thermally grown silicon dioxide are thick enough to block out implantations of most ions, even at energies up to about 200 keV.

Figure 3C:
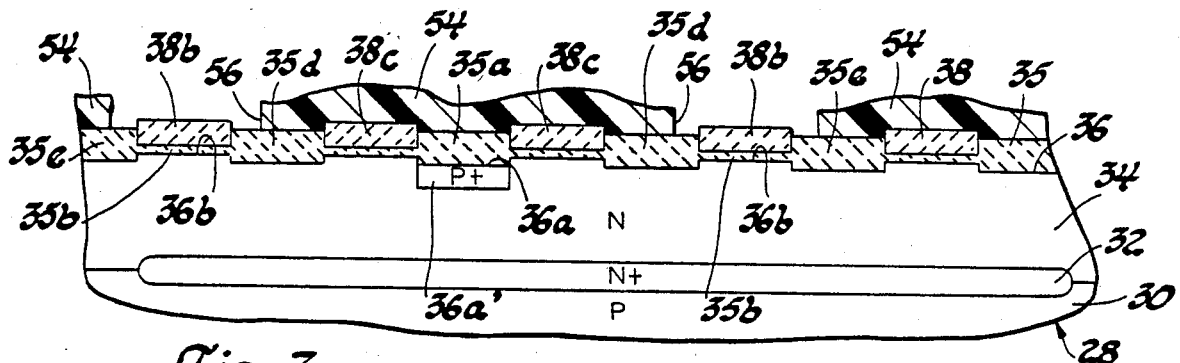

It should be recognized that the thick thermal oxide portions 35a, 35d and 35e are grown by consuming their underlying portions of surface 36. Consequently, the resultant upper surface 36 of wafer 28 is no longer planar between emitter surface 36a and collector surface 36b as can be seen in FIG. 3c. This non-planar surface characteristic between adjacent surface features is a unique characteristic of the products of this invention. The steps between emitter surface 36a and collector surface 36b are shown to be equally wide. They do not have to be. In addition, one can see in FIG. 3c that the emitter surface 36a is now not coplanar with collector surface 36b. Emitter surface 36a is recessed in surface 36.

The next important step in our process is also shown in FIG. 3c. As can be seen, a third 5,000-8,000 angstrom thick blanket photoresist coating 54 is applied to the wafer surface, exposed and developed. In this third masking operation only one annular window 56 is opened in photoresist coating 54 overlying the surface area of this invention. It is over collector surface area 36b. Like alignment of window 52 in the second masking step, alignment of annular window 56 is not critical. It need only completely expose the silicon nitride ring 38b. The inner periphery of window 56 can be disposed anywhere on the thickened oxide portion 35d. Analogously, the outer periphery of window 56 can be disposed anywhere on the thickened silicon oxide portion 35e.

Wafer 28 is then exposed to an etchant selective to silicon nitride. A selective etchant is one that will significantly attack silicon nitride but not silicon oxide. One selective etching process that can be used is dry etching in a plasma of carbon-tetrafluoride and oxygen. Another is wet etching with orthophosphoric acid at 150°-160° C. for 10-60 minutes. This uncovers the thin silicon dioxide surface layer portion 35d beneath silicon nitride ring 38b. If desired, one can leave thin silicon dioxide surface layer 35b on for the next ion implantation step. However, we prefer to remove it, as for example by immersing wafer 28 for 5-10 seconds in a hydrofluoric acid-based etchant. Immersion for only a few seconds in the hydrofluoric acid-based etchant will not significantly reduce the thickness or attack the edges of the exposed parts of the thickened silicon dioxide surface portions 35d and 35e. Hence, the exposed parts of thickened silicon dioxide portions 35d and 35e will still effectively block ion implantation and automatically precisely delineate surface area 36b for ion implantation. In that sense, surface area 36b is self aligned.

Figure 3D:
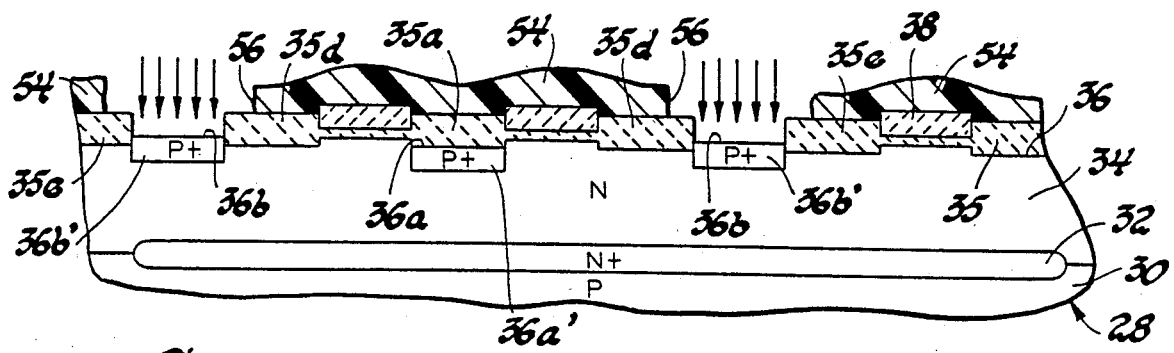

Referring now to FIG. 3d, wafer 28 is then given a blanket implant of $^{11}B^+$ having an energy of about 150-200 keV in a dosage of about $1 \times 10^{14} - 1 \times 10^{16}$ atoms per square centimeter. This provides a P+ doped region 36b' which will serve as the collector region in the resultant PNP transistor after anneal. It will also be seen that the upper surface 36b of collector region 36b' remains at a higher level on wafer surface 36 than the upper surface 36a of emitter region 36a'. If the subsequent processing steps do not inherently anneal the wafer 28 to activate the implanted regions 36a' and 36b', a separate heating step can be provided at this point. The photoresist mask 54 is then stripped from the wafer surface.

Also, if desired, a low resistance N+ contact enhancement region 58 can be provided at this point in the process. If desired, it can be provided by applying a fourth layer of photoresist, and opening an island-like window in the fourth photoresist layer over the surface 36 where the base contact enhancement region 58 is desired. The wafer can then be given a N+ blanket implant to form the N+ region 58 where the wafer surface is exposed. The photoresist would, of course, be about 5,000-8,000 angstroms thick and, if desired, the principles of this invention can be used to eliminate the need for precise location of the ion implant window. However, to avoid overcomplication in the description of this embodiment of the invention, this specific step of the process is not specifically illustrated in the drawing. However, the results of this step can be seen in FIG. 3e.

Figure 3E:
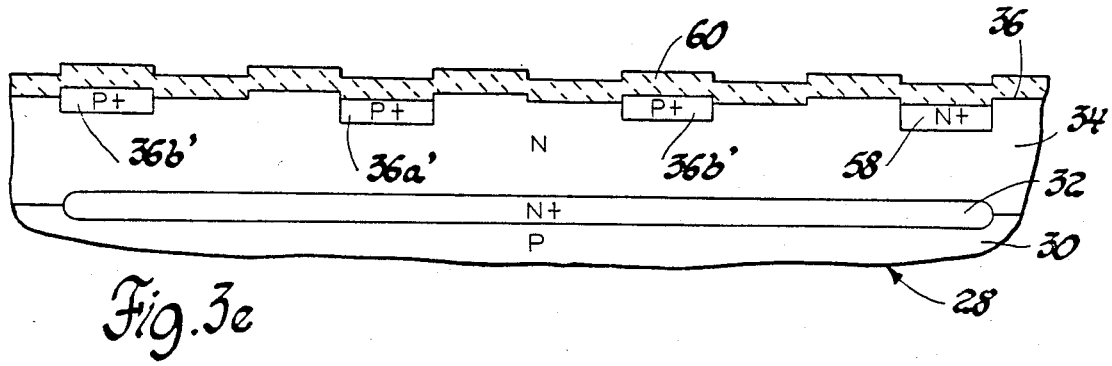
Figure 3F:
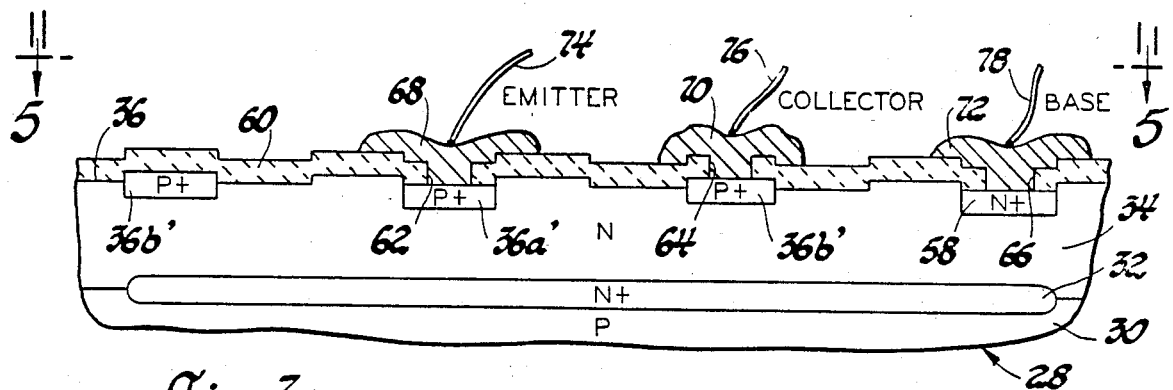
Figure 4:
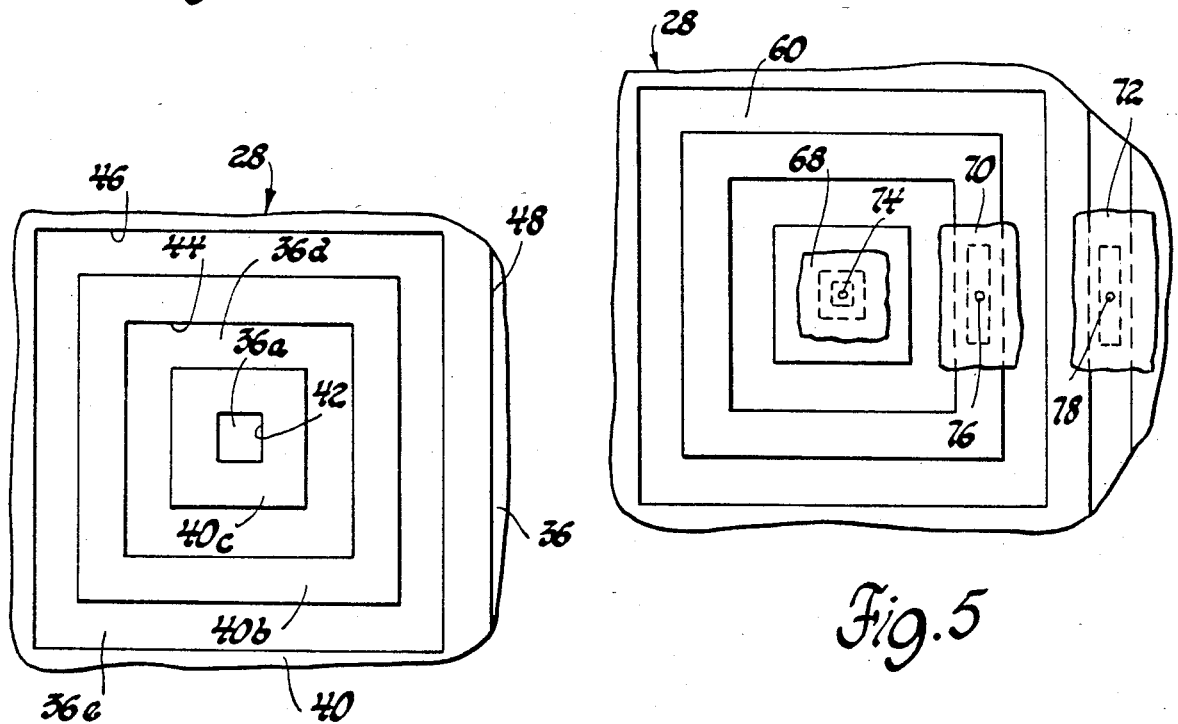
Figure 5:
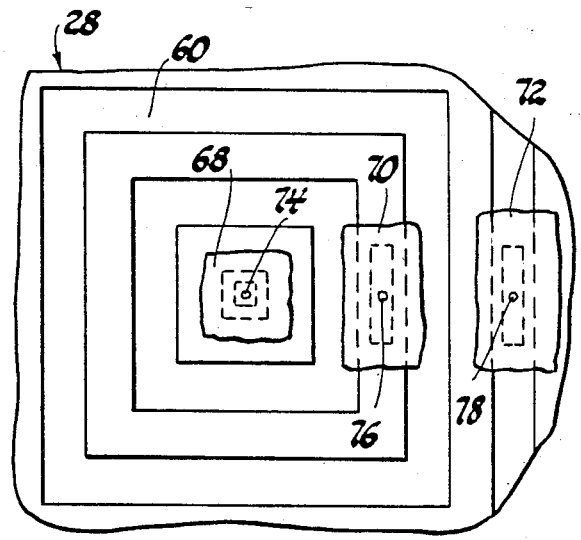
FIG. 5 shows an elevational view along the line 5—5 of FIG. 3f.

Next, as can be seen from FIG. 3e, all of the previously formed silicon dioxide layer 35, and all of the remaining silicon nitride 38 are preferably stripped from the upper surface 36 of wafer 28. A new silicon oxide coating 60 is then formed on surface 36. The new silicon oxide coating 60 can be a deposited coating or a thermally formed coating. It can be of any convenient thickness, as for example about 5,000 angstroms.

Contacts are then formed by applying still another blanket layer of photoresist (not shown) over silicon oxide coating 60. It is exposed and developed to form an etch mask (also not shown) for opening contact windows in silicon oxide layer 60 to regions 36a', 36b' and 58. Double layer photoresist masking may be used, if desired. Wafer 28 is then immersed in a hydrofluoric acid-based etchant, and the contact windows 62, 64 and 66, respectively, opened up in the silicon oxide coating 60 over the emitter region 36a', the collector region 36b' and the enhanced base contact region 58.

A blanket layer of metal is then applied over the etched silicon oxide layer 60. The blanket layer of metal can be applied by any technique and can be of any suitable single or multiple layer. We prefer to use a single layer of aluminum or aluminum-silicon alloy, applied by evaporation techniques. Other metals that one might use are titanium-tungsten-gold laminates and the like. In addition, one might choose to substitute a highly doped polycrystalline silicon for the metal in these contacts. The blanket conductor layer is then photolithographically etched in a normal and accepted manner. The etching removes all metal not desired on the surface. In so doing, it delineates discrete emitter, collector and base contacts, that are referred to by reference numbers 68, 70 and 72 in FIG. 3f and FIG. 5. The contacts 68, 70 and 72 would normally be connected to other portions of the integrated circuit of which this PNP lateral transistor is a part. We prefer to illustrate these connections by wires 74, 76 and 78 respectively.

One might prefer to include a passivation coating over the entire surface of the chip after it has been metalized. However, to better focus on the invention, we elected not to show such a coating. Nevertheless, any of the usual final passivation coatings normally preferred in manufacturing integrated circuits could also be used in connection with this invention. This invention does not affect the need, or lack of need, for such a coating. Such coatings that might be used include, overlayers of silicon oxide, silicon nitride, silicates, polyimide resins, silicone resins, etc. The need for the passivation coating as well as the type of passivation coating that is desired would, of course, vary depending upon the package in which the chip is to be placed, and the environment within which the package is going to be used.

In the preceding example of the invention we describe forming both the emitter and the collector by ion implantation. It should be recognized that, if one desires, the collector 36b' could also be formed by diffusion. In such instance the photoresist coating 54 would be removed after etching away silicon nitride ring 38b and thin silicon oxide ring 35b. Boron could then be deposited, and wafer 28 heated to drive the boron into surface portion 36b to form the collector region 36b'. The base contact enhancement region 58 could be analogously formed using a phosphorous deposition and drive-in.

Figure 6A:
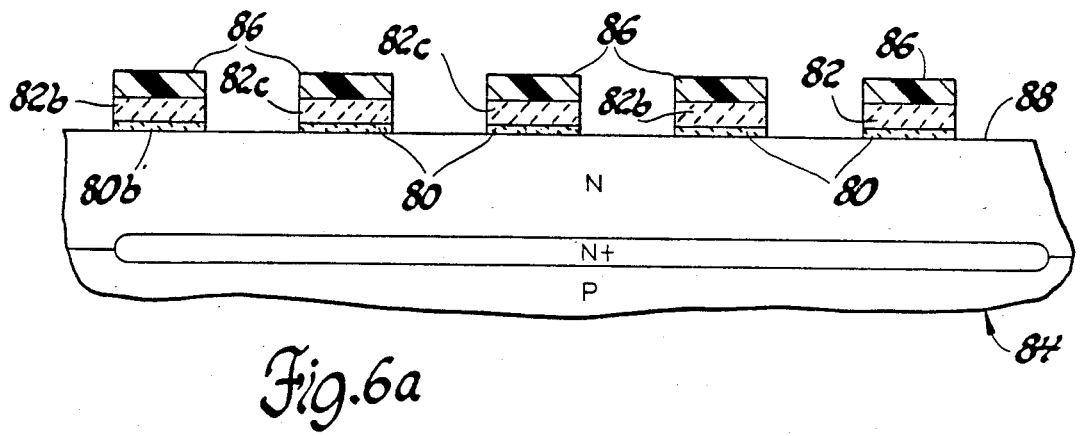
FIGS. 6a through 6f show successive detailed cross-sectional fragmentary views of a concentric lateral transistor as produced by our process using diffusion for doping.
Figure 6B:
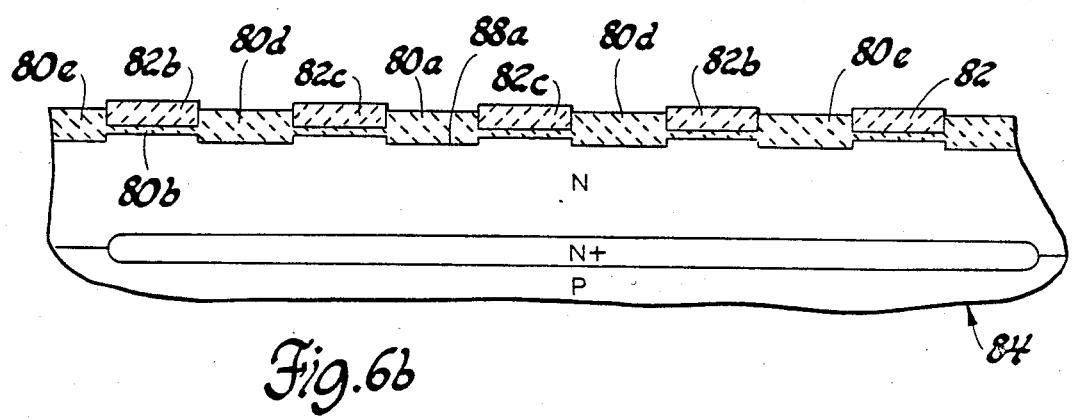
Figure 6C:
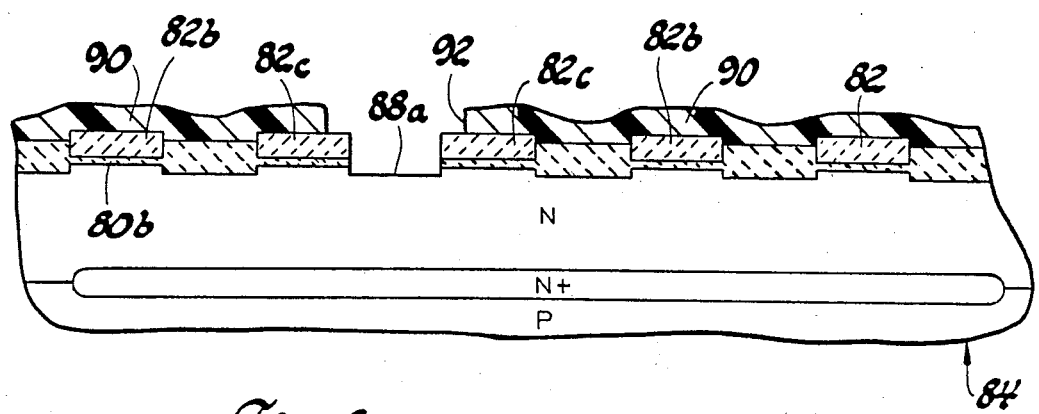

It should be recognized that this invention does not require the use of ion implantation to form the emitter either. As can be seen from FIGS. 6a through 6f, one can use this invention with diffusion techniques to form both the emitter and the collector in a lateral transistor. However, the process must be varied somewhat from that shown in FIGS. 3a-3f, FIG. 4 and FIG. 5. However the all-diffusion variation of our process starts out the same. For example, the structure shown in FIG. 6a is the same as that shown in FIG. 3a, and is formed in precisely the same manner. Accordingly, FIG. 6a represents a unique concentric pattern formed by photolithographically etching a thin blanket layer 80 of silicon dioxide and an overlying thicker silicon nitride layer 82, that are disposed on the upper surface of a silicon wafer 84. Silicon wafer 84 would of course correspond to silicon wafer 28 in the preceding example of this invention.

The structure shown in FIG. 6a is formed by photoetching using an overlying photoresist layer 86. After concentric silicon nitride rings 82c and 82b have been delineated, the photoresist layer 86 is stripped from wafer 84, and wafer 84 heated in an oxidizing atmosphere. A thick silicon dioxide island 80a is formed within silicon nitride ring 82c. Thick silicon dioxide rings 80d and 80e are formed on opposite sides of the silicon nitride ring 82b. Concurrently the silicon surface on wafer 84 becomes nonplanar under the thick oxide 80a, 80d and 80e, as surface 36 became nonplanar under thick oxide 35a, 35d and 35e in FIG. 3c.

After the thermal oxidation, a blanket photoresist coating 90 is applied to the wafer 84. A window 92 is opened in photoresist coating 90 to expose the thick oxide portion 80a. Wafer 84 can then be immersed in a hydrofluoric acid based etchant to selectively etch away the thick silicon dioxide island 80a to expose silicon surface portion 88a. Because a selective etchant is used, window 92 in photoresist coating 90 need only be coarsely aligned on the silicon nitride ring 82c. Photoresist layer 90 can then be stripped from the wafer surface. Boron is then deposited on the wafer surface and driven into the exposed surface portion 88a to some extent. Drive-in of the deposited boron forms P+ type region 88a' that will become the emitter region in the resultant transistor. We choose to show it as a thick region at this point primarily for convenience of illustration. Concurrently, a thick oxide portion 80a' is reformed over the surface 88a.

Figure 6D:
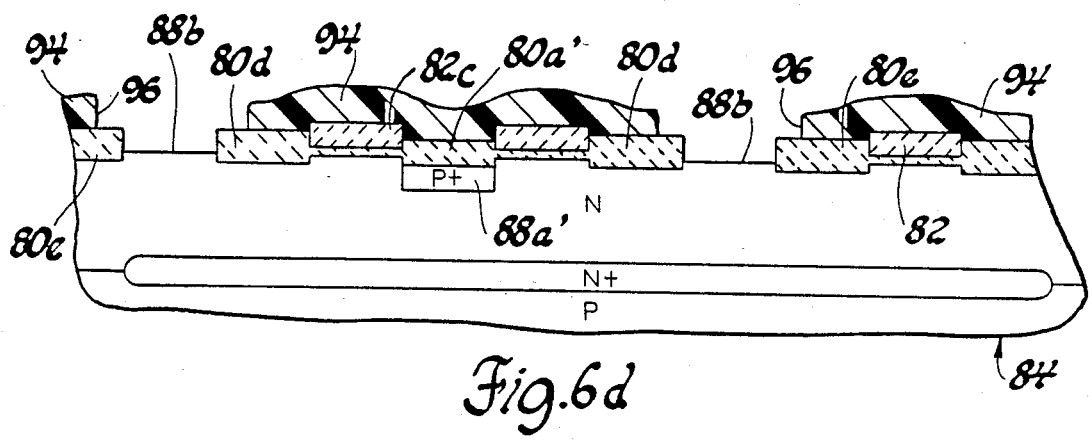
Figure 6E:
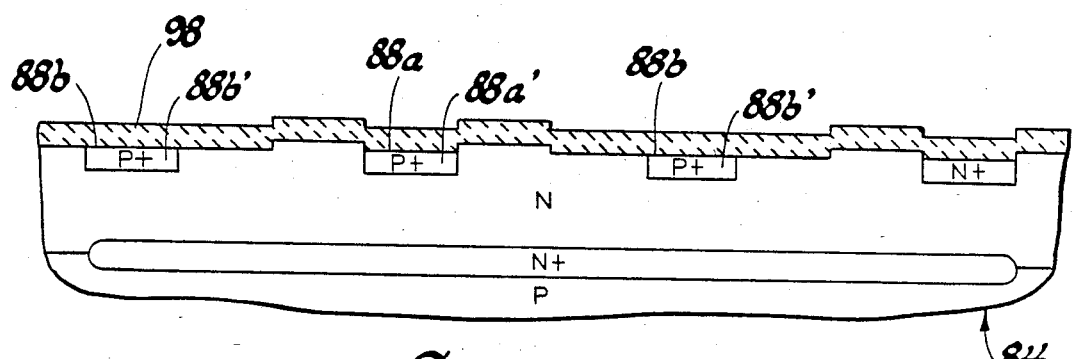

After emitter region 88a' has been formed, a third blanket coating of photoresist 94 is formed on wafer 84 and an annular window 96 opened in it over the silicon nitride ring 82b. The resultant product is shown in FIG. 6d. It should be recognized that window 96 need only be coarsely aligned because the silicon nitride ring 82b and its underlying thin silicon dioxide portion 80b will be selectively etched away in the same manner that silicon nitride ring 38b and thin oxide portion 35b were etched away in the preceding example of this invention. Hence the periphery of window 96 need only be coarsely aligned on the thick oxide rings 80d and 80e. Hence this is a high yield masking operation. In any event annular surface area 88b is automatically precisely aligned a predetermined distance from the emitter surface area 88a.

The photoresist layer 94 shown in FIG. 6d is then stripped from wafer 84. Boron is then deposited onto the surface of wafer 84, particularly surface 88b, and wafer 84 heated to drive the boron into the wafer. The boron drive-in forms the collector region 88b' beneath the surface region 88b and simultaneously reforms a thick oxide coating (not shown) on surface portion 88b. Concurrently emitter region 88a' thickens. The thickening is not shown because it forms no part of this invention. Also, the oxide regrowth recesses both of surfaces 88a and 88b into the wafer 84. Hence both the emitter and collector surfaces are recessed in this embodiment of the invention, not just one of them as in the preceding embodiment of this invention. However, in both embodiments, the emitter and collector surfaces are separated by a surface step as described in the preceding embodiment of the invention.

Figure 6F:
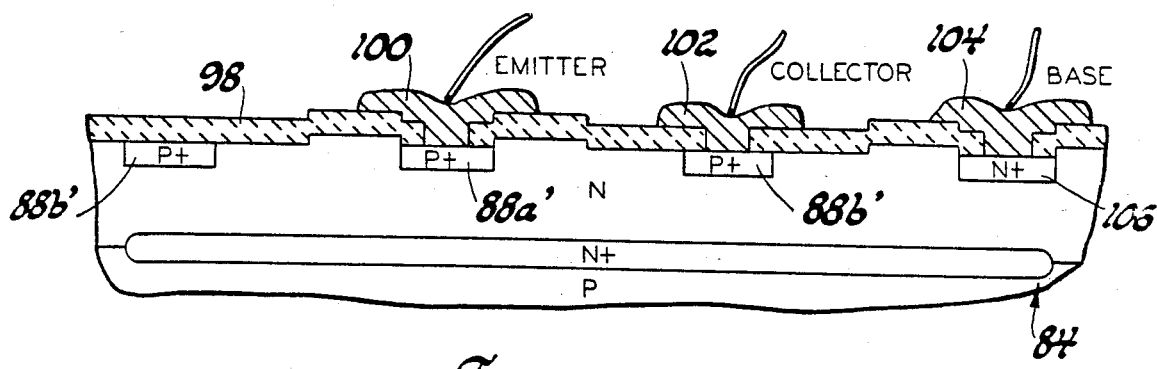
Figure 7A:
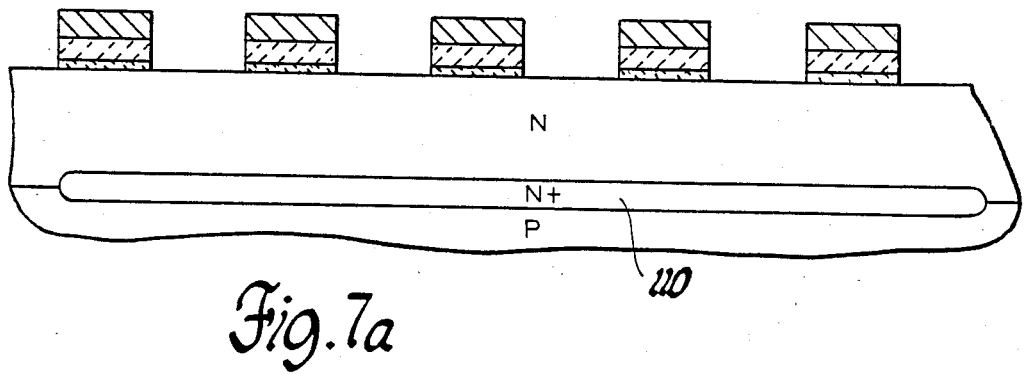
FIGS. 7a through 7f show successive detailed cross-sectional fragmentary views in which an isolation diffusion is used to make a concentric lateral transistor.
Figure 7B:
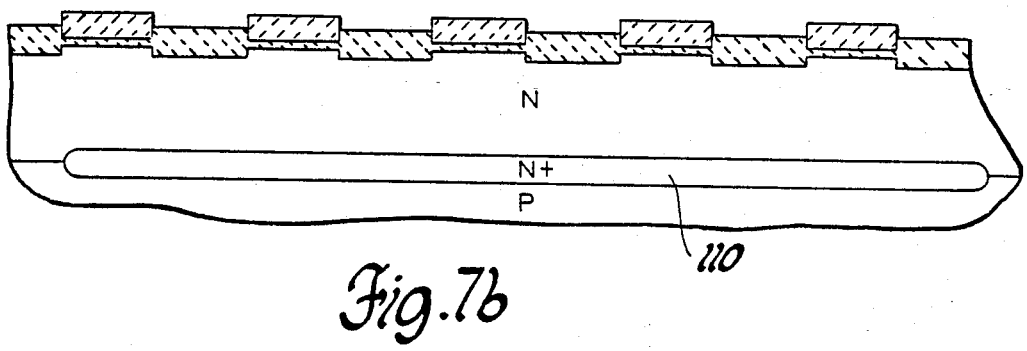
Figure 7C:
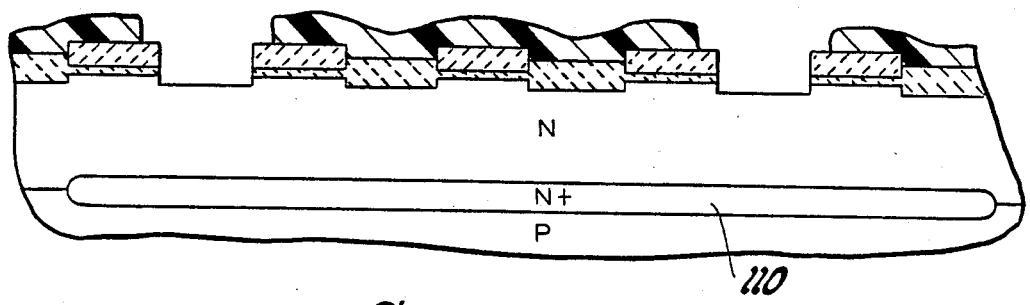
Figure 7D:
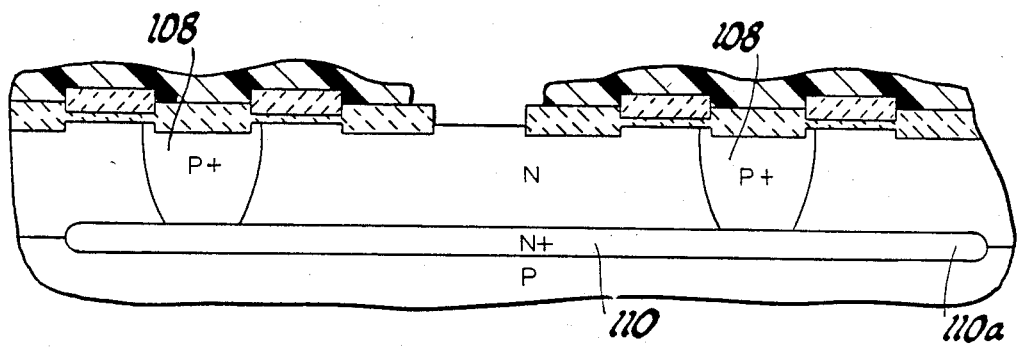
Figure 7E:
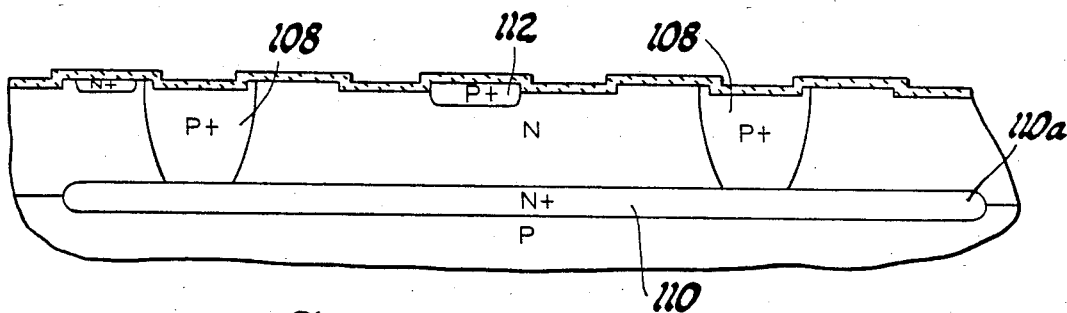
Figure 7F:
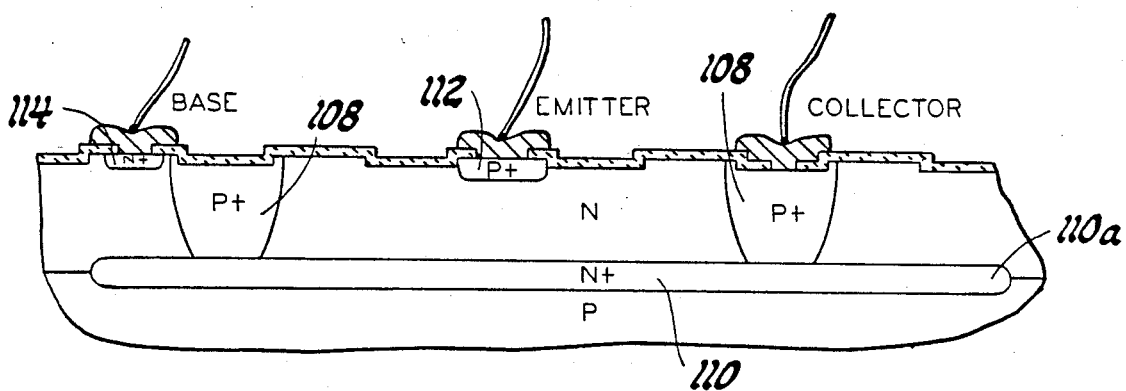
Figure 8A:
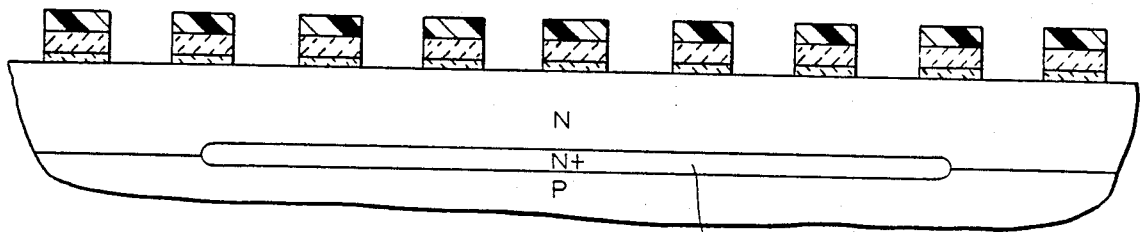
FIGS. 8a through 8g show successive detailed cross-sectional fragmentary views similar to those of FIGS. 7a through 7f wherein a base contact is predictably precisely spaced between two isolation diffusions.
Figure 8B:
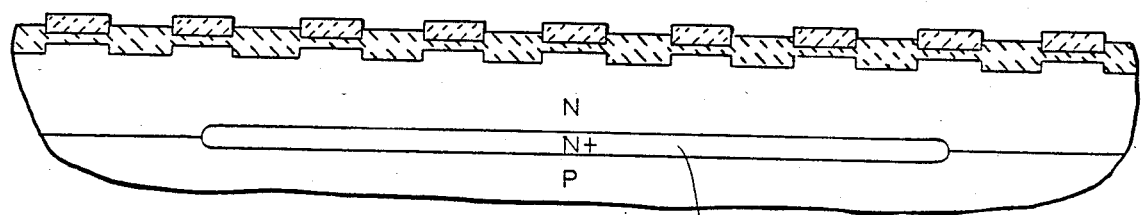
Figure 8C:
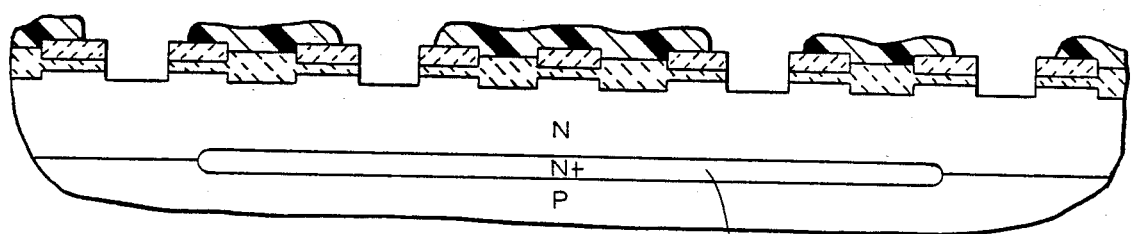
Figure 8D:
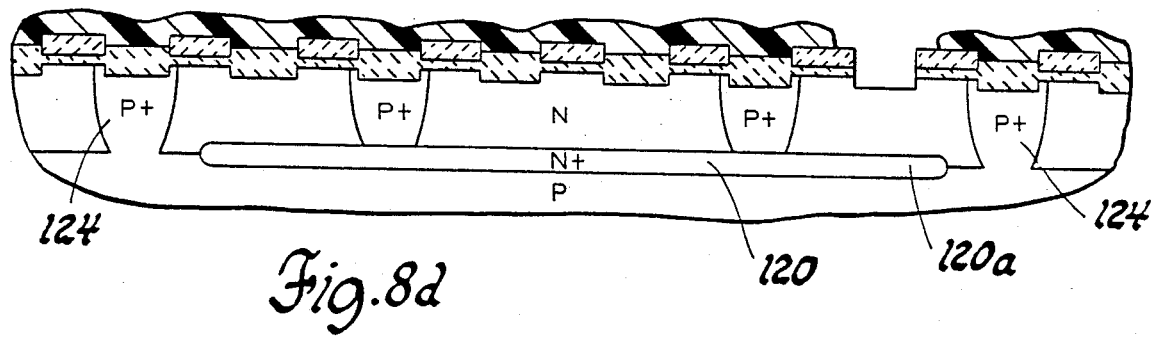
Figure 8E:
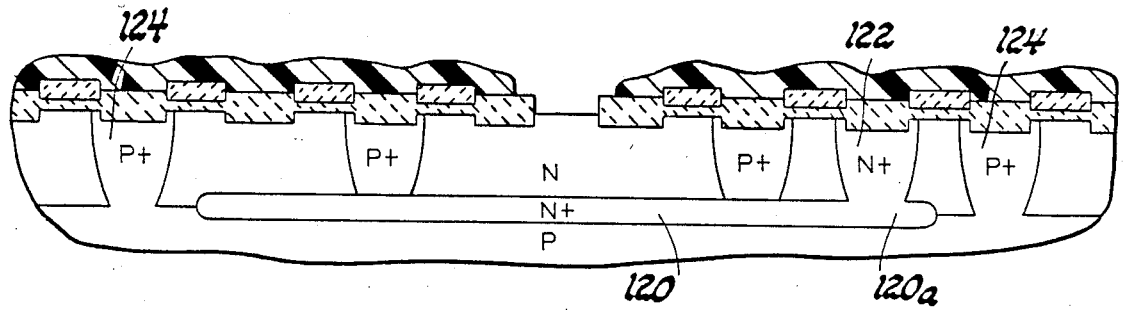
Figure 8F:
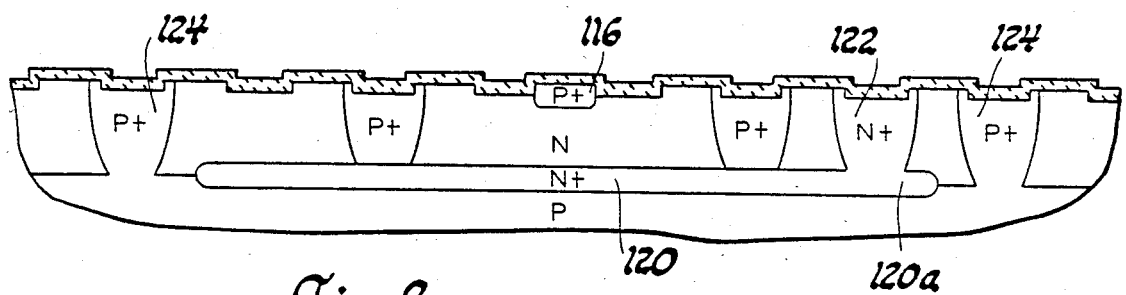
Figure 8G:
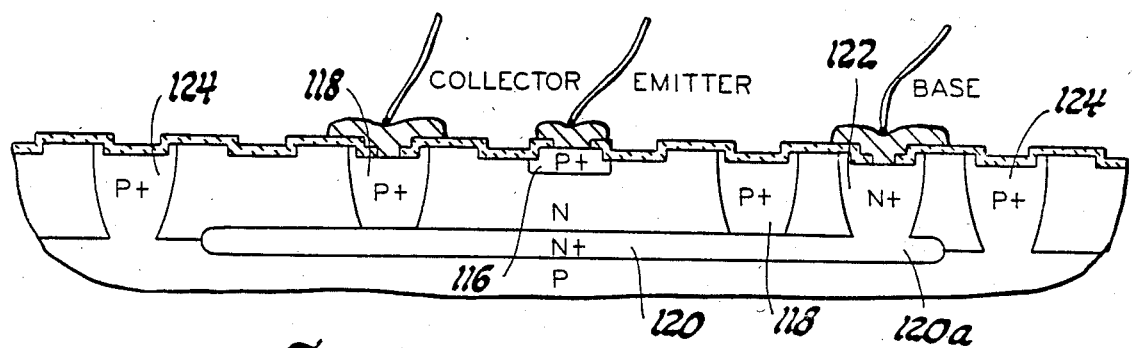

After the collector region 88b' has been formed, we prefer to strip all of the silicon nitride and silicon dioxide from the upper surface 88 of the wafer and a new silicon dioxide layer 98 deposited thereon. The wafer 84 is then finished in the same manner as described for the preceding embodiment of this invention to produce the resultant product shown in FIG. 6f. FIG. 6f shows an emitter contact 100 for emitter region 88a', a collector contact 102 for collector region 88b' and a base contact 104 for an N+ base enhancement region 106.

Pitch can also be used to separate surface features when an isolation diffusion is used to form the collector of a lateral PNP transistor. FIGS. 7a through 7f illustrate such a structure. In substance, one can substitute an isolation diffusion region 108 for a conventional lateral collector (i.e. "base") diffusion when following a process such as outlined in the example shown in FIGS. 6a through 6f. However it can also be seen that in this embodiment of the invention the collector diffusion, i.e. the isolation diffusion, is performed first. One chooses to perform the isolation diffusion first because it is the longest diffusion and would significantly alter the nature of an emitter diffusion if the emitter diffusion were performed first. Accordingly the emitter and collector diffusions are reversed when one uses the isolation diffusion to form the collector region of the lateral PNP transistor. In addition it should also be noted that the substrate buried layer region 110 has a portion 110a that extends outside the concentric isolation diffusion 108, to facilitate making a base contact to the N-type region between the island-like emitter region 112 and the concentric collector ring 108. In most instances one would prefer to also include an N+ base enhancement region 114 over the substrate buried layer extension 110a to reduce base contact resistance. We wish to also point out that pitch, i.e. a line and a space, can also be used to space isolation diffusion regions apart, and to aid in precisely spacing a deep N+ diffusion from them or between them. The process sequence is analogous to that hereinbefore described, and is illustrated by FIGS. 8a through 8g. FIGS. 8a through 8g show an island-like emitter region 116 surrounded by an isolation diffusion collector ring 118, both of which are disposed over an N+ substrate buried layer region 120. The substrate buried layer region 120 has a portion 120a that extends outwardly from the isolation diffusion collector ring 118 to permit a deep N+ region 122 to make direct contact with it. The deep N+ region 122 provides a base contact region accurately spaced from the collector isolation diffusion 118 and the usual isolation diffusion ring 124.

It should be recognized that the rings described in the preceding embodiments of the invention could be circular or rectangles. In many instances, particularly where the design is made with computer aid, the rings would be rectangular in configuration. Further, a patch as used herein could mean a ring-shaped island as well as an island not having a hole in it. Hence, by island, we mean to include a ring shape as well. By the word strip we mean a portion of any shape, not just a straight line of material. Also, the etchants, layers, layer compositions, can be widely varied without departing from the spirit of this invention. Analogously, while the preceding embodiments of this invention have been described as a PNP lateral transistor, it should be understood that the device could alternatively be an NPN transistor. Still further, the device need not be a lateral transistor. The principles of this invention can be used to precisely separate surface features for any device that one might choose to make.

The embodiments of the invention in which an exclusive property of privilege is claimed are defined as follows:

1. A photolithographic method of more predictably and uniformly spacing features on a surface of a semiconductor device comprising:
    masking a semiconductor surface to delineate an adjacent pair of surface areas in which boundaries of one area are negatively defined and boundaries of the other feature are positively defined, effective to separate the so-defined surface areas by both negatively and positively defined surface areas therebetween;
    forming a surface feature on one of the aforesaid pair of surface areas masking while retaining the aforesaid definition of the other surface area and also retaining the aforesaid dual definition of separation therebetween; and
    forming a surface feature on the other of the aforesaid pair of surface areas, while still retaining a dual definition of separation therebetween;
    whereby the two surface features can be predictably and uniformly spaced as formed, regardless of swelling or shrinkage in photoresist used to delineate the boundaries of the aforesaid surface areas or in successively forming the aforesaid surface features.

2. A photolithographic method of making more predictably spaced doped areas on a semiconductor surface comprising:
    photolithographically defining a first dielectric mask on a semiconductor substrate surface to delineate an adjacent pair of surface areas in which boundaries of one area are defined by a first window and boundaries of the other area are defined by a patch, whereby the two surface areas are separated by a portion of masking material and a second window in the masking material, effective to predictably space the first window and the dielectric patch, regardless of non-predictable photoresist anomalies;
    doping one of the pair of surface areas through the first window while retaining the dielectric patch on the other surface area, wherein the patch remains predictably spaced from the one surface area;
    covering both of the aforesaid windows with a second dielectric that leaves the patch of first dielectric exposed;
    selectively removing the patch by means of an etchant selective to the first dielectric, to thereby expose the other of the pair of surface areas and retain its predictable spacing from said one surface area; and
    doping the exposed other semiconductor surface area.

3. A photolithographic method of making more predictably spaced regions of one conductivity type on a silicon semiconductor surface portion of opposite conductivity type, comprising:
    photolithographically defining a silicon nitride mask on an N-type semiconductor substrate surface portion to delineate an adjacent pair of surface areas in which boundaries of one surface area are defined by a first window in the silicon nitride and boundaries of the other surface area are defined by a silicon nitride patch, whereby the two surface areas are separated by a strip of silicon nitride and a second window area in the silicon nitride effective to allow photoresist used in defining the silicon nitride mask to shrink or swell after exposure without changing separation distance between corresponding boundaries of the first window and the patch;

doping the one semiconductor surface area to the one conductivity type through the first window, while retaining the aforesaid silicon nitride patch on the other surface area, whereby the other surface area remains predictably spaced from the one surface area;

oxidizing the silicon exposed in both of the windows;

selectively removing the silicon nitride patch by means of an etchant selective silicon nitride but not silicon oxide and thereby expose the other semiconductor surface area, which is predictably spaced from said one area; and doping the exposed other semiconductor surface area to the one conductivity type.

4. A photolithographic method of making more predictably spaced regions of one conductivity type on a silicon semiconductor surface portion of opposite conductivity type, comprising:

photolithographically defining a silicon nitride mask on a semiconductor surface portion of one conductivity type to delineate an adjacent pair of silicon surface areas in which boundaries of one surface area are defined by a first window in the silicon nitride and boundaries of the other surface area are defined by a silicon nitride patch, whereby the two surface areas are separated by a strip of silicon nitride and a second window area in the silicon nitride effective to allow photoresist used in defining the silicon nitride mask to shrink or swell after exposure without changing separation distance between corresponding boundaries of the first window and the patch;

covering areas outside the first window with an ion implant impenetrable coating;

implanting the one surface area through the first window with ions opposite to the one conductivity type, while retaining the aforesaid silicon nitride patch on the other surface area, whereby the other surface area remains predictably spaced from the one surface area;

oxidizing the silicon surface exposed in both of the windows;

covering areas outside said silicon nitride patch with an ion implant impenetrable coating;

selectively removing the silicon nitride patch by etching, to thereby expose the other of said pair of surface areas, and retain its predictable spacing from said one area; and implanting the exposed other surface area with ions opposite to the one conductivity type.

5. A photolithographic method of making more predictably spaced regions of one conductivity type on a silicon semiconductor surface portion of opposite conductivity type, comprising:

photolithographically defining a silicon nitride mask on an N-type semiconductor surface portion of one conductivity type to delineate an adjacent pair of silicon surface areas in which boundaries of one surface area are defined by a first window in the silicon nitride and boundaries of the other surface area are defined by a silicon nitride patch, whereby the two surface areas are separated by a strip of silicon nitride and a second window area in the silicon nitride effective to allow photoresist used in defining the silicon nitride mask to shrink or swell after exposure without changing separation distance between corresponding boundaries of the first window and the patch;

oxidizing the silicon exposed in both of the windows;

selectively etching away silicon oxide in the first window to retain the aforesaid silicon nitride patch and its predictable spacing from the first window;

diffusing the one silicon surface area exposed in the first window with an impurity opposite to the one conductivity type;

selectively etching away the silicon nitride patch, to expose the other of said pair of silicon surface areas while retaining its predictable spacing from the one of said pair of silicon surface areas; and diffusing the exposed other silicon surface area with an impurity opposite to the one conductivity type.

6. A method of making laterally spaced concentric-type transistor regions having a more predictable spacing, comprising:

applying a blanket coating of a first dielectric to a semiconductor surface portion of one conductivity type;

applying a first photoresist coating to said first dielectric coating;

exposing and developing the photoresist to define an island of photoresist, a first concentric annular window around the island, a concentric ring of photoresist around the first annular window, and a second concentric annular window around the concentric ring;

etching away the silicon nitride exposed within both annular windows to form concentric inner and outer windows around an island in the silicon nitride coating, and then removing the photoresist;

covering the island and first annular window with a second coating of photoresist, effective to mask all of the surface portion but the outer annular window from ion implantation;

implanting ions of a conductivity-determining impurity opposite to that dominant in the surface region into the surface to form an annular transistor region in said surface portion;

removing the second photoresist layer and coating the semiconductor surface areas exposed in the windows with a second dielectric;

selectively etching away the first dielectric island while masking the balance of the first dielectric island effective to expose the semiconductor surface area beneath the island; and forming a second region of the type opposite to that dominant in the semiconductor surface portion in the last mentioned semiconductor surface area, to form an island-like region of opposite conductivity type precisely located laterally from the first region.

7. A method of making a concentric-type lateral bipolar transistor having a more predictable gain comprising:

applying a blanket coating of silicon nitride to a silicon semiconductor surface portion of one conductivity type;

applying a blanket first coating of photoresist over the silicon nitride coating;

exposing and developing the photoresist to define a patch of photoresist, a first concentric annular space around the patch, a concentric ring of photoresist around the first annular space, and a second concentric annular space around the concentric ring;

etching away the silicon nitride exposed within both the annular spaces to form concentric inner and outer windows around an island in the silicon nitride coating, and then removing the first photoresist coating;

covering the island and inner annular window of the semiconductor surface portion with a second coating of photoresist;

exposing the surface portion to an ion beam of a conductivity-type dopant opposite to that dominant in the surface region, effective to form a lateral transistor annular collector region only within the outer annular window;

removing the second photoresist coating and oxidizing silicon exposed within the windows to at least form a silicon oxide ring surrounding the silicon nitride island;

selectively etching away the silicon nitride island and thereby exposing an emitter island surface area, the outer periphery of which is defined by the inner periphery of the silicon oxide ring and is precisely located with respect to the inner periphery of the annular collector region; and exposing the surface portion again to the opposite conductivity-type impurity, effective to convert the exposed emitter island surface area to a lateral transistor emitter region, wherein the silicon oxide ring precisely concentrically defines the outer periphery of the emitter region with respect to the inner periphery of the annular collector region and provides a lateral transistor of more predictable gain.

* * * * *